US012757713B2

(12) United States Patent
Lanzillo et al.

(10) Patent No.: US 12,757,713 B2
(45) Date of Patent: Oct. 6, 2026

(54) THROUGH LAYER SKIP VIA

(71) Applicant: INTERNATIONAL BUSINESS MACHINES CORPORATION, Armonk, NY (US)

(72) Inventors: Nicholas Anthony Lanzillo, Wynantskill, NY (US); Ruilong Xie, Niskayuna, NY (US); Albert M. Chu, Nashua, NH (US); Reinaldo Vega, Mahopac, NY (US); Lawrence Alfred Clevenger, Saratoga Springs, NY (US); Brent A. Anderson, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 339 days.

(21) Appl. No.: 18/644,971

(22) Filed: Apr. 24, 2024

(65) Prior Publication Data

US 2025/0336805 A1 Oct. 30, 2025

(51) Int. Cl.

| | |
|---|---|
| ***H10W 20/42*** | (2026.01) |
| ***H10W 20/00*** | (2026.01) |
| ***H10W 20/43*** | (2026.01) |

(52) U.S. Cl.

CPC ......... *H10W 20/42* (2026.01); *H10W 20/082* (2026.01); *H10W 20/084* (2026.01); *H10W 20/089* (2026.01); *H10W 20/43* (2026.01)

(58) Field of Classification Search

CPC . H10W 20/42; H10W 20/082; H10W 20/084; H10W 20/089; H10W 20/43

See application file for complete search history.

(56) References Cited

U.S. PATENT DOCUMENTS

| | | | | |
|---|---|---|---|---|
| 9,613,861 | B2 | 4/2017 | Anderson et al. | |
| 9,805,972 | B1 | 10/2017 | Zhang et al. | |
| 10,020,255 | B1 | 7/2018 | Bao et al. | |
| 10,049,920 | B1 | 8/2018 | Anderson et al. | |
| 10,573,593 | B2 | 2/2020 | Lin et al. | |
| 11,315,827 | B2 | 4/2022 | Huang et al. | |
| 11,488,864 | B2 | 11/2022 | Bae et al. | |
| 2016/0093566 | A1 * | 3/2016 | Ting | H10W 20/42 438/643 |
| 2021/0313264 | A1 | 10/2021 | Park et al. | |
| 2022/0037202 | A1 * | 2/2022 | Lin | H10W 20/063 |
| 2022/0223473 | A1 | 7/2022 | Anderson et al. | |
| 2023/0066614 | A1 | 3/2023 | Clevenger et al. | |
| 2023/0163064 | A1 | 5/2023 | Mukesh et al. | |
| 2023/0170293 | A1 | 6/2023 | Mignot et al. | |
| 2023/0178474 | A1 | 6/2023 | Bhosale et al. | |
| 2023/0187341 | A1 | 6/2023 | Lanzillo et al. | |

OTHER PUBLICATIONS

Authors et al., (Disclosed Anonymously), "Method for Providing a Skip-Level Via above a Top-Via Metal Level", IP.com No. IPCOM000260008D, Oct. 8, 2019, pp. 1-4.

* cited by examiner

*Primary Examiner* — Marc-Anthony Armand
(74) *Attorney, Agent, or Firm* — Harrity & Harrity, LLP

(57) ABSTRACT

A semiconductor device includes a through layer skip via that traverses an intermediary metal layer. The through layer skip via has a damascene metal portion and a subtractive metal portion. A dielectric spacer is disposed within a thickness of the intermediary metal layer and surrounds a top portion of the subtractive metal portion.

20 Claims, 5 Drawing Sheets

THROUGH LAYER SKIP VIA

BACKGROUND

The present invention generally relates to semiconductor devices and processing methods, and more particularly to skip vias that include a subtractively etched portion and a damascene portion that traverses a plurality of metal layers.

Semiconductor devices include metal structures that can have a number of parallel metal lines connected to metal lines in other layers using vias. In some instances, it is beneficial to have a via pass through an intermediary metal layer to make direct contact between an upper metal line and a lower metal line, through the intermediary metal layer.

In conventional devices, metal lines in the intermediary metal layer are broken to provide a gap or space through which a skip via can pass. The skip via skips the intermediary level and does not connect to the intermediary level. This means that sufficient space is needed to pass the skip via through the intermediary level in order to prevent shorting to the metal in the intermediary level. The metal lines of the intermediary metal layer are broken and recessed away from the skip via.

The skip via needs to traverse a long distance (e.g., three metal layers deep) and is formed by a damascene process in which a dielectric layer is opened up and etched through the metal layers. A via opening in this case is tapered and becomes extremely narrow at a contact point deep within the metal layers of the semiconductor device.

A need exists for a skip via that can be formed without breaking metal lines in an intermediary metal layer and can be formed without an extensive taper through a plurality of metal layers. A further need exists for a through layer skip via that reliable reduces or eliminates shorting risks to an intermediary level through which the through layer skip via passes.

SUMMARY

In accordance with an embodiment of the present invention, a semiconductor device includes a through layer skip via that traverses an intermediary metal layer. The through layer skip via has a damascene metal portion and a subtractive metal portion. A dielectric spacer is disposed within a thickness of the intermediary metal layer and surrounds a top portion of the subtractive metal portion.

In other embodiments, the damascene metal portion and the subtractive metal portion can be connected outside the dielectric spacer. The damascene metal portion can include a dual damascene structure. The damascene metal portion can include a semi damascene structure. The damascene metal portion can include a single damascene structure. The damascene metal portion can include a width larger than a width of the subtractive metal portion. The damascene metal portion can include a different material than the subtractive metal portion. The damascene metal portion can include an opposite taper from a taper of the subtractive metal portion.

In accordance with another embodiment of the present invention, a semiconductor device, includes a first metal level having subtractive metal features including a subtractive metal extended via that extends to a second metal level and a dielectric spacer disposed within a thickness of the second metal level and surrounding a top portion of the subtractive metal extended via. A third metal level has damascene metal features including a damascene via that connects to the subtractive metal extended via to form a through layer skip via.

In other embodiments, the subtractive metal extended via can connect to the damascene via outside the dielectric spacer. The damascene metal features can include a dual damascene structure. The damascene metal features can include a semi damascene structure. The damascene metal features can include a single damascene structure. The damascene via can include a width larger than a width of the subtractive metal extended via. The damascene via can include a different material than the subtractive metal extended via. The damascene via can include an opposite taper from a taper of the subtractive metal extended via.

In accordance with another embodiment of the present invention, a semiconductor device, includes a first metal level having subtractive metal features including metal lines, regular via and an extended via, the extended via extending to a second metal level. A dielectric spacer is disposed within a thickness of the second metal level and surrounds a top portion of the extended via. A third metal level has damascene metal features including a damascene via having an opposite taper from a taper of the extended via. The damascene via connects to the extended via outside the dielectric spacer to form a through layer extended via.

In other embodiments, the damascene via can include a semi damascene structure, a single damascene structure or a dual damascene structure. The damascene via can include a width larger than a width of the extended via. The damascene via can include a different material than the extended via.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
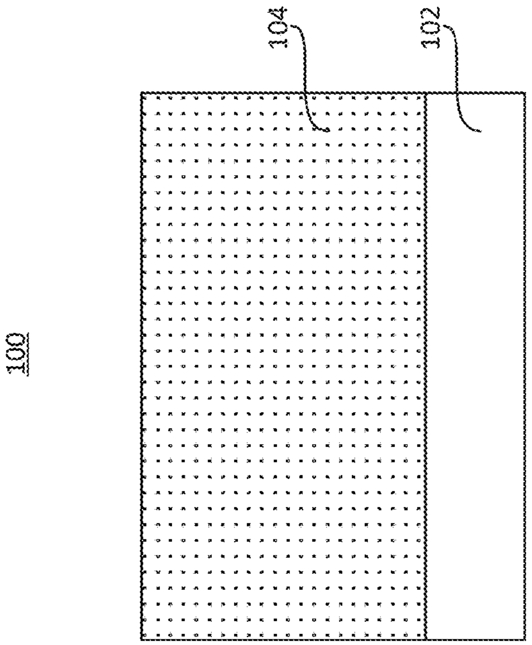
FIG. 1 shows a cross-sectional view of a substrate and a metal layer formed thereon, in accordance with an embodiment of the present invention.

In accordance with embodiments of the present invention, devices and methods are described which include a skip via that traverses a metal line layer without having to break the metal lines in the metal line layer through which it passes. This type of skip via will be referred to as a through layer skip via. The through layer skip via is formed through different processes which form different portions or segments of the through layer skip via. In an embodiment, a skip via structure includes an upper segment or portion and a lower segment or portion. The lower segment includes a subtractive metal, and the upper segment includes a damascene metal. Damascene metal features include a damascene via having an opposite taper from a taper of an extended via formed from the subtractive metal features. A portion of the lower segment can be separated from an intermediate wiring level by a dielectric spacer. The dielectric spacer is formed directly on the through layer skip via, which ensures its dielectric encapsulation and reliable protects against shorting to the intermediate wiring level.

In other embodiments, the upper segment can have a width larger than a width of the lower segment. The upper segment can include a different metal than the lower segment. In some embodiments, the upper segment can include a dual damascene, a semi damascene or a single damascene metal structure. In an embodiment, a single damascene upper segment can be recessed. The recess can provide clearance when forming additional metal structures over the upper segment.

In accordance with embodiments of the present invention, methods for forming a semiconductor device can include depositing a metal layer. Subtractively etching the metal layer to form vias and metal lines. The vias can include regular vias, metal lines and extended vias. The extended vias are taller than the regular vias, which are taller than the metal lines. The extended vias traverse the via level and a first metal layer and further exceed the first metal layer and the via level in height. A dielectric layer or material is formed over the subtractively etched metal layer (e.g., the regular vias, metal line layer and extended vias). The dielectric layer is recessed to expose a top portion of the extended via (but not the regular vias). The top portion is subjected to a spacer formation process to form a spacer around lateral sides of the top portion. A second metal layer is deposited and planarized to expose the top portion. Another dielectric layer or material is formed over the top portion, the spacer and the second metal layer. The recently formed dielectric layer is patterned, and metal structures are formed using a damascene approach. The damascene approach forms metal lines and/or vias. In an embodiment, a damascene via is formed to complete the through layer skip via.

The damascene approach can include a dual damascene, a single damascene or a semi-damascene structure. The extended via formed includes a subtractively etched portion or segment and a damascene formed portion or segment. The extended via formed in accordance with embodiment of the present invention is compatible with subtractive interconnect integration, which is not trivial to do. Further, the extended via passes through an intermediate metal line, without requiring a line break of the metal lines of the intermediate layer through which the extended via passes. The extended via can enable a zero-track. This means that the extended via consumes no extra area in the metal layer through which it passes.

Referring now to the drawings in which like numerals represent the same or similar elements and initially to FIG. 1, devices and methods for manufacturing a semiconductor device are shown in accordance with embodiments of the present invention. A wafer 100 includes a substrate 102 having one or more layers on which the semiconductor device will be fabricated. FIG. 1 depicts a cross-sectional view of the substrate 102 and a deposited metal layer 104.

The substrate 102 can include any suitable structure and can include a semiconductor substrate, e.g., a bulk semiconductor, a semiconductor-on-insulator (SOI) substrate, etc., and preferably includes a monocrystalline semiconductor. The substrate 102 can include a fabricated front end of line (FEOL) structure having field effect transistors, and other devices formed thereon. In addition, the substrate 102 can include middle of the line (MOL) contacts to connect the FEOL structures to back end of line (BEOL) metal structures through dielectric materials.

In one example, the substrate 102 can include a Si-containing semiconductor substrate. Illustrative examples of Si-containing semiconductor materials suitable for the semiconductor substrate can include, but are not limited to, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The substrate 102 can be fabricated through MOL structures. However, it should be understood that the structures described herein can be included in any metallization for any device type. The metallization described herein can be included in BEOL structures, backside interconnect layers, far back end of the line (FBEOL) structures or any other structures having a plurality of metal line layers and at any position where skip vias can be employed.

A conductive deposition is performed over the substrate 102 to form a metal layer 104. The metal layer 104 can include, e.g., Cu, Ru, Mo, Rh, W, Ir, and alloys or combinations of these and other conductive materials. In a particularly useful embodiment, the conductive fill includes Ru. The conductive fill can be formed using a deposition method, such as, e.g., chemical vapor deposition (CVD), plasma enhanced CVD (PECVD), atomic layer deposition (ALD) or any other suitable deposition method. The conductive deposition can optionally be planarized, e.g., by chemical mechanical polishing (CMP).

Figure 2:
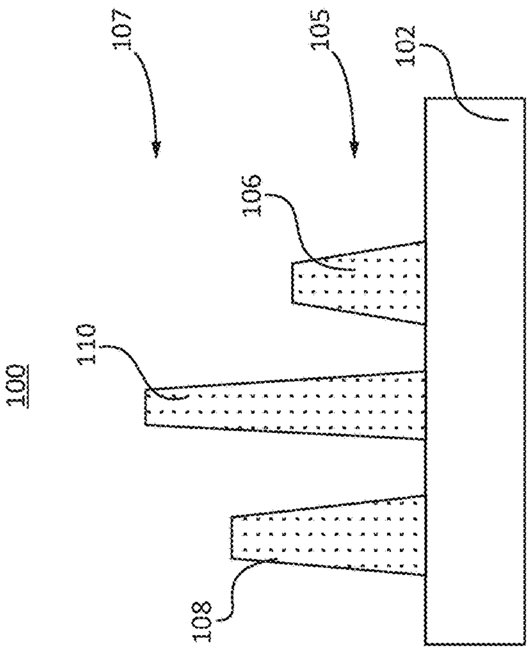
FIG. 2 shows a cross-sectional view after subtractive etching to form subtractive metal features, in accordance with an embodiment of the present invention.

Referring to FIG. 2, a subtractive etch process or processes are carried out to form different metal structures from the metal layer 104. In an embodiment, metal lines 106 are formed by a first etch process by exposing portions of the metal layer 104 through an etch mask (not shown). Then, another etch mask (not shown) can be employed to etch vias 108 while blocking off other regions of the wafer 100. The vias 108 extend further than the metal lines 106 (e.g., are taller). Another etch mask (not shown) can be employed to etch extended via 110 while blocking off other regions of the wafer 100. The extended via 110 extend further than the metal lines 106 and the vias 108 (regular vias). Each of the features of the subtractive etch can be formed in any order since their formation is independently carried out relative to the others.

The vias 108 and metal lines 106 occupy a metal level, which can be referred to as a first metal level 105 (e.g., M1 metal). It should be understood metal level 105 can be anywhere in a stack of metal levels and is not limited to being positioned in a first metal level position. The extended via 110 extends beyond the first metal level 105 to at least partially traverse a second metal level 107.

Figure 3:
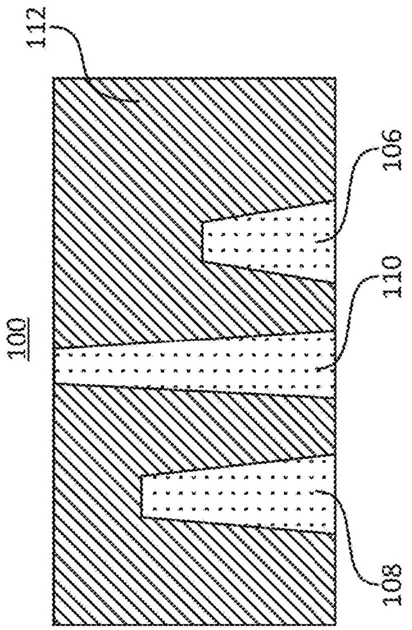
FIG. 3 shows a cross-sectional view after depositing a dielectric material over the subtractive metal features, in accordance with an embodiment of the present invention.

Referring to FIG. 3, a dielectric material 112 is formed on the wafer 100. The dielectric material 112 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric material 112 can be deposited using CVD, although other deposition methods can be employed.

The dielectric material 112 can be planarized to expose a top surface of the extended via 110. The planarization process can include a chemical mechanical polishing (CMP) process.

Figure 4:
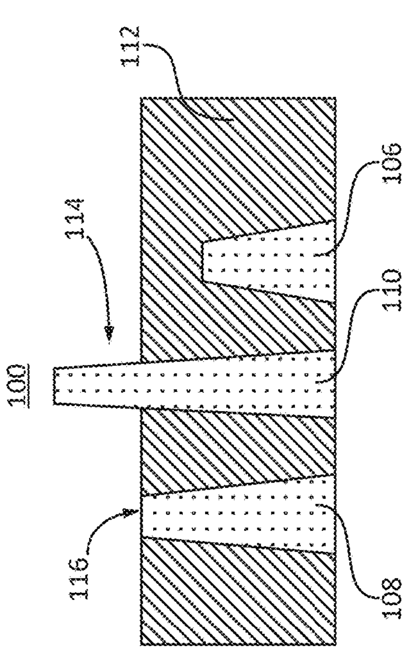
FIG. 4 shows a cross-sectional view after recessing the dielectric material to expose a top portion of the extended via, in accordance with an embodiment of the present invention.

Referring to FIG. 4, the dielectric material 112 is recessed to expose a top portion 114 of the extended via 110. The recess can include a wet or dry etch that recesses the dielectric material 112 until a top 116 of the via 108 is reached.

Figure 5:
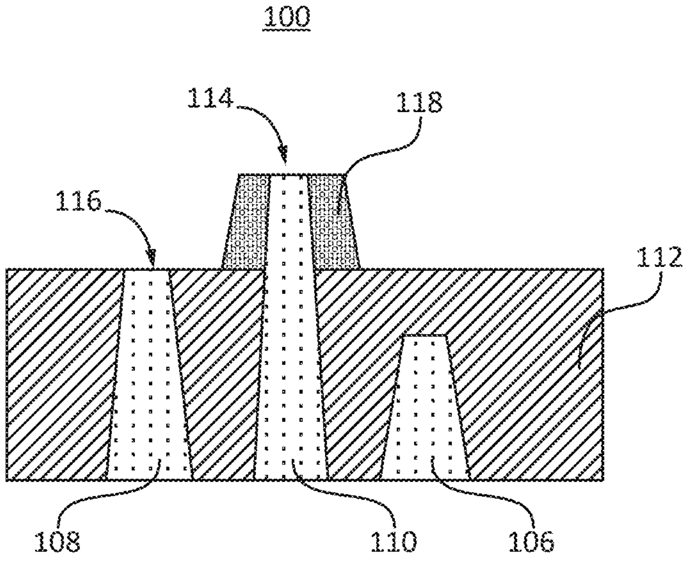
FIG. 5 shows a cross-sectional view after forming a dielectric spacer over the top portion of the extended via, in accordance with an embodiment of the present invention.

Referring to FIG. 5, the top portion 114 of the extended via 110 needs to be protected from a metal deposition for the second metal level 107. In an embodiment, a sidewall spacer process is employed. A conformal dielectric deposition is performed that covers the surface of the dielectric material 112 and a top and sides of the top portion 114 of the extended via 110. The conformal dielectric deposition can include a nitride or oxynitride (e.g., SiN, SiON, etc.). Other dielectric materials can also be employed. In an embodiment, conformal dielectric deposition can be performed using a CVD or ALD deposition technique.

An anisotropic etch is performed, e.g., a reactive ion etch (RIE), to remove the conformal dielectric deposition materials from horizontal surfaces to form a spacer 118 about the top portion 114 of the extended via 110. The anisotropic etch exposes a top surface of the vias 108 to permit contact with a next metal layer to be formed. The spacer 118 encapsulates sides of the top portion 114 of the extended via 110. A height of the spacer 118 corresponds with a thickness of a next metal level.

Figure 6:
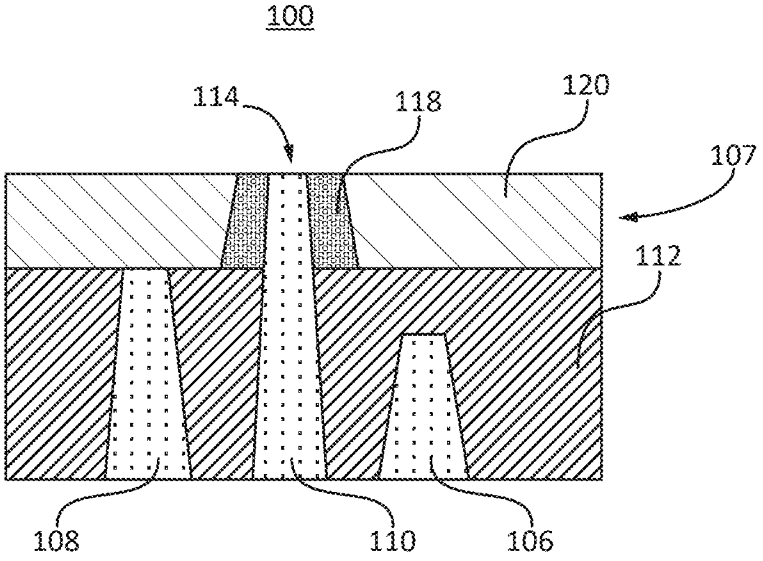
FIG. 6 shows a cross-sectional view after forming a second metal layer, in accordance with an embodiment of the present invention.

Referring to FIG. 6, a conductive deposition is performed over the dielectric material 112, and the top portion 114 of the extended via 110 to form a second metal layer 120 at the second metal level 107. The second metal layer 120 can include, e.g., Cu, Ru, Mo, Rh, W, Ir, and alloys or combinations of these and other conductive materials. In a particularly useful embodiment, the conductive fill includes Cu. The conductive fill can be formed using a deposition method, such as, e.g., CVD, PECVD, ALD or any other suitable deposition method. The conductive deposition can be planarized, e.g., by CMP. CMP exposes a top surface of the top portion 114 of the extended via 110. The height of the spacer 118 corresponds with a thickness of the second metal level 107 and is at least as thick as the second metal layer 120. This ensures reliable electrical isolation of the top portion 114 of the extended via 110 from the second metal layer 120 without the risk of voids or other issues that could occur in conventional methods which employ breaking metal lines to form a skip via.

Figure 7:
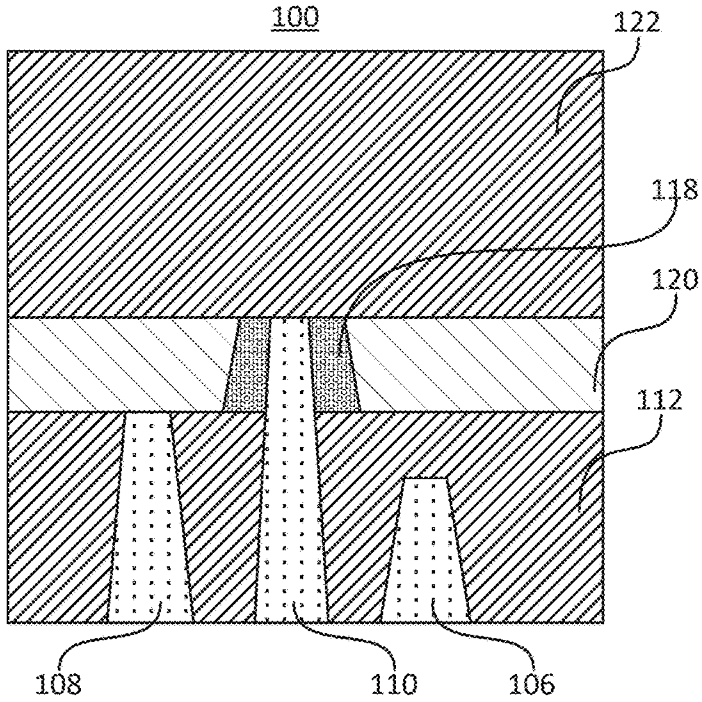
FIG. 7 shows a cross-sectional view after forming dielectric material on the second metal layer, in accordance with an embodiment of the present invention.

Referring to FIG. 7, a dielectric material 122 is formed on the wafer 100 and covers the metal layer 120, the spacer 118 and the extended via 110. The dielectric material 122 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric material 122 can include a same or different material than the dielectric material 112. The dielectric material 122 can be deposited using CVD, although other deposition methods can be employed. The dielectric material 122 can be planarized, e.g., by CMP.

Figure 8:
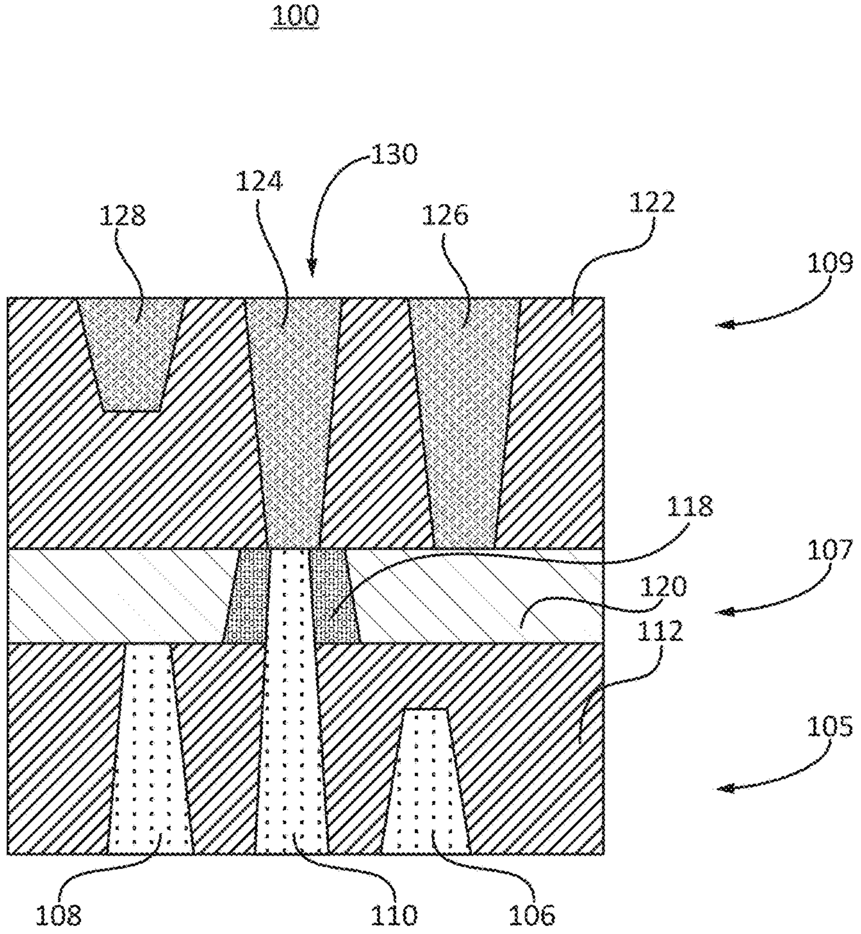
FIG. 8 shows a cross-sectional view after patterning the dielectric material and depositing conductive material therein to form damascene features having a dual damascene structure to form a through layer skip via, in accordance with an embodiment of the present invention.

Referring to FIG. 8, a patterned photoresist (not shown) or other etch mask or masks can be applied to a surface of the dielectric material 122. The etch mask or masks can be applied in stages to form the different features of a third metal levels 109. For example, openings for vias 124 and vias 126 can be performed concurrently, while openings for metal lines 128 can be etched in a separate etch process.

Once patterned, openings in the dielectric material 122 can include a diffusion barrier (not shown) deposited in the openings prior to a conductive fill. The diffusion barrier can include, e.g., TiN, TaN, or similar materials. A conductive deposition process can concurrently fill the openings to form metal features, such as, vias 124, vias 126 and metal lines 128. The conductive deposition is performed to fill the openings on top of the diffusion barrier, if present. The conductive deposition can include materials, such as, e.g., Cu, Ru, Mo, Rh, W, Ir, and alloys or combinations of these and other conductive materials. In a particularly useful embodiment, the conductive fill includes Cu. The conductive deposition can be formed using a deposition method, such as, e.g., CVD, PECVD, ALD or any other suitable deposition method. The conductive deposition is planarized, e.g., by CMP, to complete a through layer skip via 130.

In FIG. 8, a dual damascene process is shown where a metal line and a connection to the metal are concurrently formed in a single deposition of conductive material. Via 124 is formed and connects to a top surface of the extended via 110 to form the through layer skip via 130. The spacer 118 surrounds the top portion 114 of the extended via 110. The spacer 118 electrically isolates the extended via 110 from the metal layer 120 as it passes through the metal layer 120. In this way, the through layer skip via 130 connects the first metal level 105 to the third metal level 109 by passing through or skipping the second metal levels 107 (e.g., an intermediary wiring level).

The through layer skip via 130 includes a damascene metal upper segment (via 124) and a subtractive metal lower segment (extended via 110). The conductive material of the upper segment can be the same as or different from the lower segment. The dimensions of the upper segment can be different than the lower segment. For example, in an embodiment, the upper segment can have a greater width than the lower segment.

Figure 9:
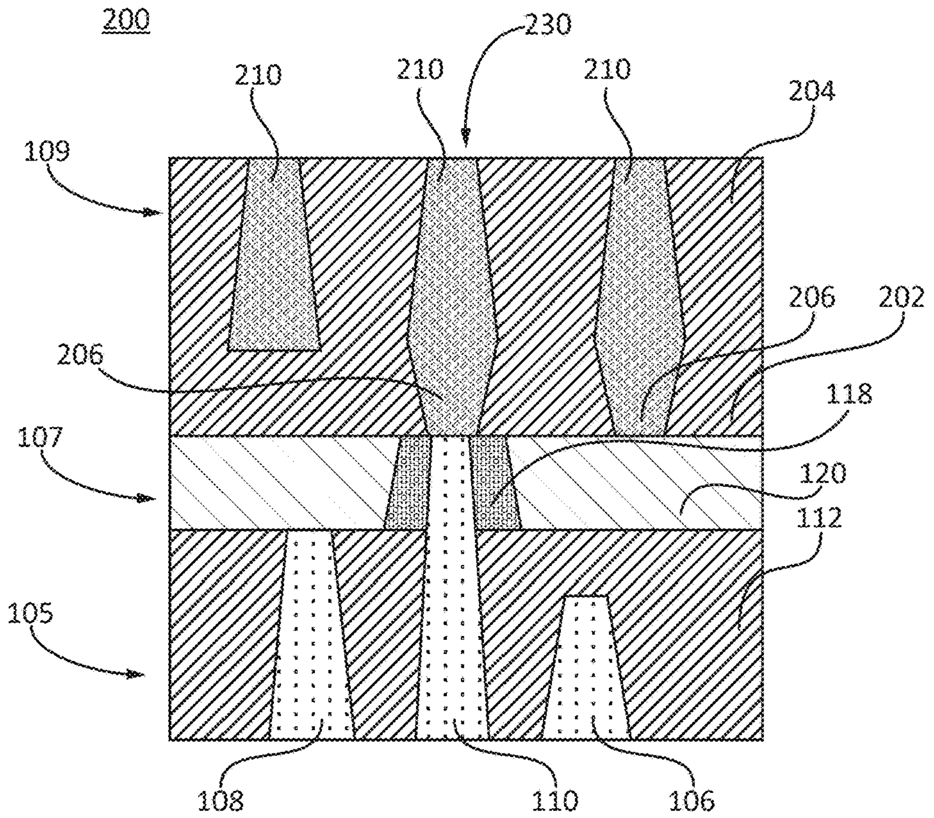
FIG. 9 shows a cross-sectional view after patterning the dielectric material and depositing conductive material therein to form damascene features having a semi damascene structure to form a through layer skip via, in accordance with an embodiment of the present invention.

Referring to FIG. 9, in another embodiment, starting with the structure of FIG. 7, a patterned photoresist (not shown) or other etch mask or masks can be applied to a surface of a dielectric material 202 deposited over the metal layer 120. The etch mask can be employed to form openings for vias 206 for the third metal level 109.

Once patterned, the openings in the dielectric material 202 can include a diffusion barrier (not shown) deposited in the openings prior to a conductive fill. The diffusion barrier can include, e.g., TiN, TaN, or similar materials. A conductive deposition process can fill the openings to form the vias 206. The conductive deposition is performed to fill the openings on top of the diffusion barrier, if present, and continue to form a conductive plate at the third metal level 109. The conductive deposition can include materials, such as, e.g., Cu, Ru, Mo, Rh, W, Ir, and alloys or combinations of these and other conductive materials. In a particularly useful embodiment, the conductive fill includes Ru. The conductive deposition can be formed using a deposition method, such as, e.g., CVD, PECVD, ALD or any other suitable deposition method.

The extended via 110 connects to the via 206. Next, the conductive plate is subtractively etched by an anisotropic etch process, e.g., RIE. The anisotropic etch process forms metal lines 210. A dielectric material 204 is then deposited and planarized, e.g., by CMP.

In FIG. 9, a semi damascene process is shown where conductive material is deposited in the opening to form the via 206 and then the conductive material is further deposited to form a conductive plate in contact with the via 206. The conductive plate is then subtractively etched to form metal lines 210. Via 206 connects to a top surface of the extended via 110 to form a through layer skip via 230. The spacer 118 surrounds the top portion 114 of the extended via 110. The spacer 118 electrically isolates the extended via 110 from the metal layer 120 as it passes through the metal layer 120. In this way, the through layer skip via 230 connects the first metal level 105 to the third metal level 109 by passing through or skipping the second metal level 107 (e.g., an intermediary wiring level).

The through layer skip via 230 includes a semi damascene metal upper segment (via 206 and metal line 210) and a subtractive metal lower segment (extended via 110). The semi damascene metal upper segment itself includes a damascene portion and a subtractive metal portion. The conductive material of the upper segment can be the same as or different from the lower segments. The dimensions of the upper segment can be different than the lower segment. For example, in an embodiment, the upper segment can have a greater width than the lower segment.

Figure 10:
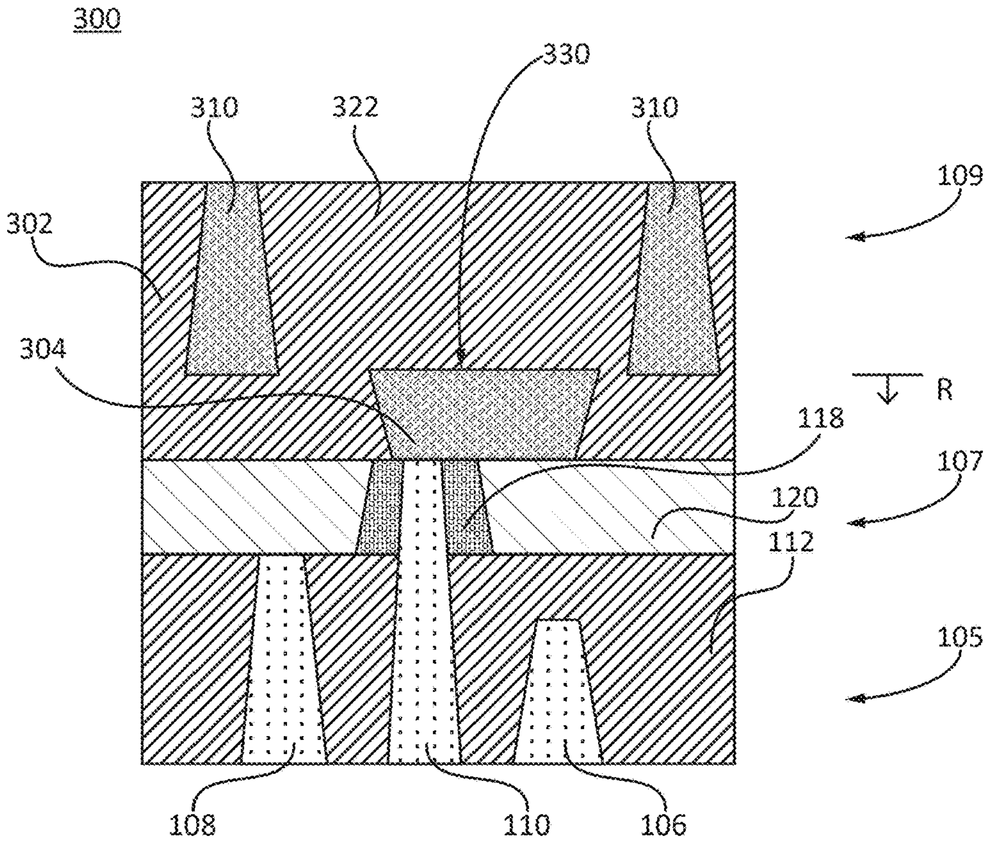
FIG. 10 shows a cross-sectional view after patterning the dielectric material and depositing conductive material therein to form damascene features having a single damascene structure to form a through layer skip via, in accordance with an embodiment of the present invention.

Referring to FIG. 10, in another embodiment, starting with the structure of FIG. 7, a patterned photoresist (not shown) or other etch mask or masks can be applied to a surface of a dielectric material 302 deposited over the metal layer 120. The etch mask can be employed to form openings for vias 304 for the third metal level 109.

Once patterned, the openings in the dielectric material 302 can include a diffusion barrier (not shown) deposited in the openings prior to a conductive fill. The diffusion barrier can include, e.g., TiN, TaN, or similar materials. A conductive deposition process can fill the openings to form the vias 304. The conductive deposition is performed to fill the openings on top of the diffusion barrier, if present, and later continue to form a conductive plate at the third metal level 109 (which can be over a dielectric layer or material that separates the via 304 from metal line 310). The conductive deposition can include materials, such as, e.g., Cu, Ru, Mo, Rh, W, Ir, and alloys or combinations of these and other conductive materials. In a particularly useful embodiment, the conductive fill includes Ru. The conductive deposition can be formed using a deposition method, such as, e.g., CVD, PECVD, ALD or any other suitable deposition method.

The extended via 110 connects to the via 304. The via 304 can optionally be recessed (a indicated by a line and arrow labeled "R") so that a dielectric layer can be formed before forming metal lines 310. In this way, a metal line can be formed in a separate process and or can be formed over the via 304 without connecting to the via 304. In other embodiments, the via 304 can be employed without recessing the via 304. A conductive plate can be deposited and subtractively etched by an anisotropic etch process, e.g., RIE. The anisotropic etch process forms metal lines 310. A dielectric material 322 is deposited and is planarized, e.g., by CMP.

In FIG. 10, a single damascene process is shown where the via 304 is formed by depositing conductive material in the via opening. Via 304 connects to a top surface of the extended via 110 to form a through layer skip via 330. The spacer 118 surrounds the top portion 114 of the extended via 110. The spacer 118 electrically isolates the extended via 110 from the metal layer 120 as it passes through the metal layer 120. In this way, the through layer skip via 330 connects the first metal level 105 to the third metal level 109 by passing through or skipping the second metal level 107 (e.g., an intermediary wiring level).

The through layer skip via 330 includes a single damascene metal upper segment (via 304) and a subtractive metal lower segment (extended via 110). The conductive material of the upper segment can be the same as or different from the lower segments. The dimensions of the upper segment can be different than the lower segment. For example, in an embodiment, the upper segment can have a greater width than the lower segment.

Processing continues from FIG. 8, 9 or 10 with the formation of additional metal levels, which can include through layer skip vias. These additional metal levels can include back end of the line (BEOL) structures having metal structures and dielectric layers to complete the semiconductor device being fabricated.

Figure 11:
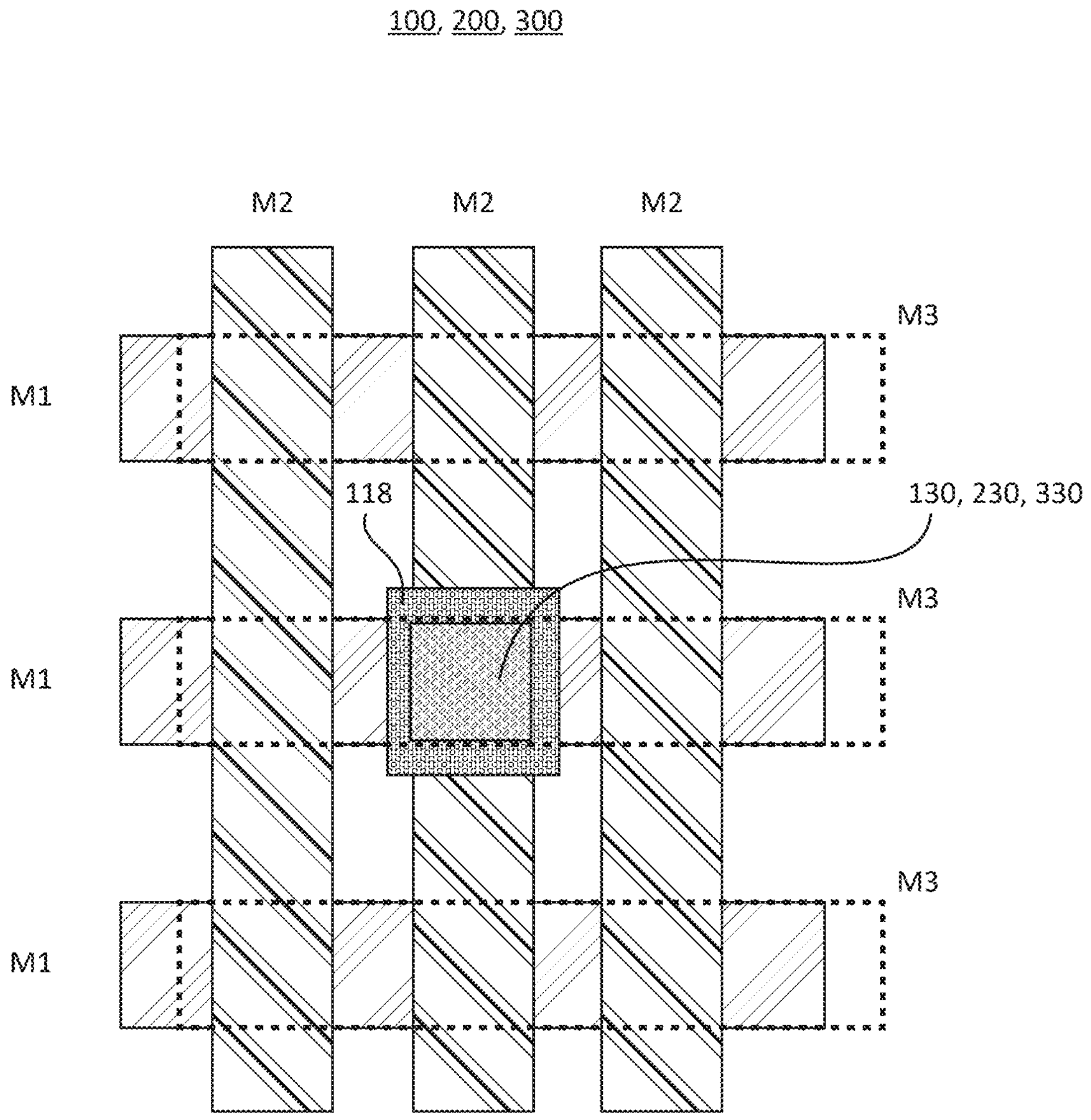
FIG. 11 shows a layout view of a through layer skip via passing through an intermediary wiring level without forming metal breaks in the intermediary wiring level, in accordance with an embodiment of the present invention.

Referring to FIG. 11, a layout shows top down view of the through layer skip via 130 (or through layer skip via 230, or through layer skip via 330). The layout view depicts a first metal layer having first metal lines, e.g., M1, a second metal layer having second metal lines, e.g., M2, and a third metal layer having third metal lines, e.g., M3, which are shown as dashed lines to permit viewing of other features. The through layer skip via 130, 230, 330 passes through the second metal layer and through a metal line M2 without having to break metal lines in the second metal layer. Instead, no line break is required for the through layer skip via 130, 230, 330 in accordance with embodiments of the present invention. The through layer skip via 130, 230, 330 includes the spacer 118 that electrically isolates the through layer skip via 130, 230, 330 as it passes through the second metal layer.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," "top," "bottom" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:

a through layer skip via that traverses an intermediary metal layer, the through layer skip via having a damascene metal portion and a subtractive metal portion; and a dielectric spacer disposed within a thickness of the intermediary metal layer and surrounding a top portion of the subtractive metal portion.

2. The semiconductor device as recited in claim 1, wherein the damascene metal portion and the subtractive metal portion connect outside the dielectric spacer.

3. The semiconductor device as recited in claim 1, wherein the damascene metal portion includes a dual damascene structure.

4. The semiconductor device as recited in claim 1, wherein the damascene metal portion includes a semi damascene structure.

5. The semiconductor device as recited in claim 1, wherein the damascene metal portion includes a single damascene structure.

6. The semiconductor device as recited in claim 1, wherein the damascene metal portion includes a width larger than a width of the subtractive metal portion.

7. The semiconductor device as recited in claim 1, wherein the damascene metal portion includes a different material than the subtractive metal portion.

8. The semiconductor device as recited in claim 1, wherein the damascene metal portion includes an opposite taper from a taper of the subtractive metal portion.

9. A semiconductor device, comprising:

a first metal level having subtractive metal features including a subtractive metal extended via that extends to a second metal level;

a dielectric spacer disposed within a thickness of the second metal level and surrounding a top portion of the subtractive metal extended via; and a third metal level having damascene metal features including a damascene via that connects to the subtractive metal extended via to form a through layer skip via.

10. The semiconductor device as recited in claim 9, wherein the subtractive metal extended via connects to the damascene via outside the dielectric spacer.

11. The semiconductor device as recited in claim 9, wherein the damascene metal features include a dual damascene structure.

12. The semiconductor device as recited in claim 9, wherein the damascene metal features include a semi damascene structure.

13. The semiconductor device as recited in claim 9, wherein the damascene metal features include a single damascene structure.

14. The semiconductor device as recited in claim 9, wherein the damascene via includes a width larger than a width of the subtractive metal extended via.

15. The semiconductor device as recited in claim 9, wherein the damascene via includes a different material than the subtractive metal extended via.

16. The semiconductor device as recited in claim 9, wherein the damascene via includes an opposite taper from a taper of the subtractive metal extended via.

17. A semiconductor device, comprising:

a first metal level having subtractive metal features including metal lines, regular vias and an extended via, the extended via extending to a second metal level;

a dielectric spacer disposed within a thickness of the second metal level and surrounding a top portion of the extended via; and a third metal level having damascene metal features including a damascene via having an opposite taper from a taper of the extended via, the damascene via connecting to the extended via outside the dielectric spacer to form a through layer extended via.

18. The semiconductor device as recited in claim 17, wherein the damascene via includes a semi damascene structure, a single damascene structure or a dual damascene structure.

19. The semiconductor device as recited in claim 17, wherein the damascene via includes a width larger than a width of the extended via.

20. The semiconductor device as recited in claim 17, wherein the damascene via includes a different material than the extended via.

* * * * *